United States Patent [19]
Ichikawa et al.

[11] Patent Number: 5,811,883
[45] Date of Patent: Sep. 22, 1998

[54] DESIGN FOR FLIP CHIP JOINT PAD/LGA PAD

[75] Inventors: Kinya Ichikawa, Ohgaki; Seiichiroh Seki; Takaya Miwa, both of Tsukuba; Yohko Mashimoto, Tsuchiura, all of Japan

[73] Assignee: Intel Corporation, Santa Clara, Calif.

[21] Appl. No.: 724,175

[22] Filed: Sep. 30, 1996

[51] Int. Cl.$^6$ .......... H01L 23/48; H01L 23/495; H01L 23/52; H01L 29/40

[52] U.S. Cl. .......... 257/778; 257/668; 257/780; 257/786; 361/767

[58] Field of Search .......... 257/668, 633, 257/737, 786, 778–780, 758; 361/748, 767, 774

[56] References Cited

U.S. PATENT DOCUMENTS

| | | | |
|---|---|---|---|
| 4,023,197 | 5/1977 | Magdo et al. | 257/758 |
| 4,175,779 | 11/1979 | Apblett, Jr. | 285/115 |
| 4,685,033 | 8/1987 | Inoue | 361/748 |
| 4,825,284 | 4/1989 | Soga et al. | 357/80 |
| 4,917,697 | 4/1990 | Osborn, III et al. | 604/387 |
| 4,964,555 | 10/1990 | Hnatuk | 225/93 |
| 5,196,371 | 3/1993 | Kulesza et al. | 437/183 |
| 5,250,843 | 10/1993 | Eichelberger | 257/692 |
| 5,252,852 | 10/1993 | Makiuchi et al. | 257/458 |
| 5,349,500 | 9/1994 | Casson et al. | 361/749 |
| 5,390,082 | 2/1995 | Chase et al. | 361/783 |
| 5,391,401 | 2/1995 | Blake et al. | 427/420 |
| 5,394,009 | 2/1995 | Loo | 257/666 |
| 5,401,689 | 3/1995 | Frei et al. | 437/209 |
| 5,417,116 | 5/1995 | Solomon et al. | 73/799 |
| 5,418,189 | 5/1995 | Heinen | 437/209 |
| 5,431,328 | 7/1995 | Chang et al. | 228/180.22 |
| 5,434,106 | 7/1995 | Lim et al. | 437/209 |
| 5,440,239 | 8/1995 | Zappella et al. | 324/757 |
| 5,472,049 | 12/1995 | Chaffee et al. | 166/250.1 |
| 5,475,236 | 12/1995 | Yoshizaki | 257/48 |

*Primary Examiner*—Teresa M. Arroyo
*Attorney, Agent, or Firm*—Blakely, Sokoloff, Taylor & Zafman

[57] ABSTRACT

A substrate for an integrated circuit package is provided. The substrate includes a first dielectric layer with a first coefficient of thermal expansion. The first dielectric layer has a bottom surface and an inner side surface. The inner side surface defines a first aperture. The substrate also includes a conductive pad having a bottom surface and a side surface. The side surface of the conductive pad engages the inner side surface of the first dielectric layer. The substrate further includes a second dielectric layer having a second coefficient of thermal expansion closely matching the first coefficient of thermal expansion. The second dielectric layer is deposited upon the bottom surface of the first dielectric layer and upon a first portion of the bottom surface of the conductive pad. The first portion of the bottom surface of the conductive pad is adjacent to the side surface of the conductive pad.

26 Claims, 4 Drawing Sheets

DESIGN FOR FLIP CHIP JOINT PAD/LGA PAD

BACKGROUND OF THE INVENTION

(1) Field of the Invention

The present invention relates to the field of integrated circuits. More specifically, the present invention relates to a substrate for an integrated circuit.

(2) Description of the Related Art

Large scale integrated circuits are well known in the art. Most large scale integrated circuits are placed in a package which includes a chip carrier (hereinafter "substrate") for coupling the circuit (semiconductor chip) to a printed circuit board. Generally, the substrate has a top surface for coupling (interconnecting) to the chip. The top surface includes electrically conductive pads, discretely disposed upon that surface, for coupling to the chip. The substrate further has a bottom surface with similar electrically conductive pads for mechanically and electrically coupling to the printed circuit board. The electrically conductive pads disposed onto the top surface of the substrate and the electrically conductive pads disposed onto the bottom surface are coupled therebetween via copper traces disposed within the substrate.

FIG. 1 shows a flip chip device 2 coupled via solder bumps 4 to a substrate 6. The substrate 6 is coupled at a bottom part thereof, via solder bumps 10, to a printed circuit board such as motherboard 8. A semiconductor chip, flip chip device 2 in this particular implementation, is coupled to substrate 6 according to a circuit interconnection method called flip chip bonding. According to this method, the bond pads a on flip chip such as flip chip 2, are not restricted to the periphery of the chip, but rather, are usually located at one face of the chip opposite the substrate. On a top surface thereof, substrate 6 has an interconnection pattern with a number of contact pads having locations and orientations of corresponding to the locations and orientations of solder bumps which electrically connect the substrate 6 to flip chip 2. The flip chip 2 is mounted on the top surface of substrate 6 by a flip chip process such that solder bump 4 establishes a contact with the interconnection pattern at the top surface of the substrate 6. Then the substrate 6 and the flip chip 2 are passed to a furnace to cause a reflowing of the solder bumps 4. Similarly, substrate 6 has a bottom surface with an interconnection pattern with electrically conductive pads disposed thereon according to a conductive pattern of a printed circuit board 8 upon which substrate 6 is mounted via solder bumps 10.

FIG. 2 shows a schematic diagram of a cross-section of a substrate 206. The substrate 206 has a lower electrode pad 216 for coupling to a motherboard and an upper electrode pad 214 for coupling to a chip. Typically, an upper and a lower part of the substrate are substantially symmetrical with respect to an axis 240 passing through a middle part of the substrate. Accordingly, the following description focuses on the lower part of the substrate being understood that this description equally applies to the upper part of substrate 206.

Substrate 206 includes a plurality of lower electrode pads of which only lower electrode pad 216 is shown in the figure. The substrate 206 may be connected to a printed circuit board (not shown) via lower electrode pad 216. Substrate 206 further includes a first dielectric layer 210 which may be made of epoxy, by way of non-limiting example. Layer 210 is a permanent mask for additive plating of copper. The substrate further includes a solder resist mask 212 which mechanically protects the permanent mask 210 of the substrate and mechanically and electrically protects a copper routing pattern including conductive trace 203. The solder resist mask 212 is also used for defining a pattern for registering solder bumps onto the lower electrode pads 216. A printed circuit board can thus be placed in a position to be electrically connected to the substrate without further movement of the flip chip, the substrate, or the printed circuit board. The lower electrode pad 216 is coupled via a copper trace 207 to an upper electrode pad 214.

An interface 211 between the lower electrode pad 216 and the permanent mask 210 is subject to a stress concentration due to a difference between a coefficient of thermal expansion (CTE) of the lower electrode pad 216 and a CTE of the dielectric layer 210. This stress concentration causes cracks in the dielectric layer 210 near the interface 211, when substrate 206 is subjected to thermal fluctuations. The stress concentration is also affected by the difference in CTE between different parts of the substrate such as between insulating layer 204 and core 222, between 210 and 212, etc. Also, cracks tend to propagate under solder resist mask 212 into the copper routing pattern, thereby causing open defects.

Typically, substrates such as the one shown in FIG. 2 are subject to a thermal aging test. According to this test, the substrate is thermally cycled between approximately −55° C. and 125° C. at a frequency of approximately two cycles per hour for at least 1,000 cycles. After having been subjected to the thermal aging tests, the substrate shown in FIG. 2 may show failure, i.e., cracking of the substrate, after 50–100 cycles of thermal cycling. The cracks are generally undesirable because they allow water and other undesirable chemicals to enter and corrode the circuitry within the substrate.

It is desirable to provide a substrate, for an integrated circuit, with reduced occurence of cracking or no cracking at all at the interface between adjacent structures included in the substrate, such as an electrode pad and an adjacent dielectric layer, when the substrate is subjected to thermo-mechanical stress.

BRIEF SUMMARY OF THE INVENTION

The present invention provides a substrate for an integrated circuit package. The substrate includes a first dielectric layer with a first coefficient of thermal expansion. The first dielectric layer has a bottom surface and an inner side surface. The inner side surface defines a first aperture. The substrate also includes a conductive pad having a bottom surface and a side surface. The side surface of the conductive pad engages the inner side surface of the first dielectric layer. The substrate further includes a second dielectric layer that has a second coefficient of thermal expansion closely matching said first coefficient of thermal expansion. The second dielectric layer is formed upon the bottom surface of the first dielectric layer and upon a first portion of the bottom surface of the conductive pad. The first portion of the bottom surface of the conductive pad is adjacent to the side surface of the conductive pad.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skills in the art should be able to practice the invention without these specific details. In some instances, well-known circuits, structures, and techniques have not been shown in detail to not unnecessarily obscure the present invention.

Figure 1:
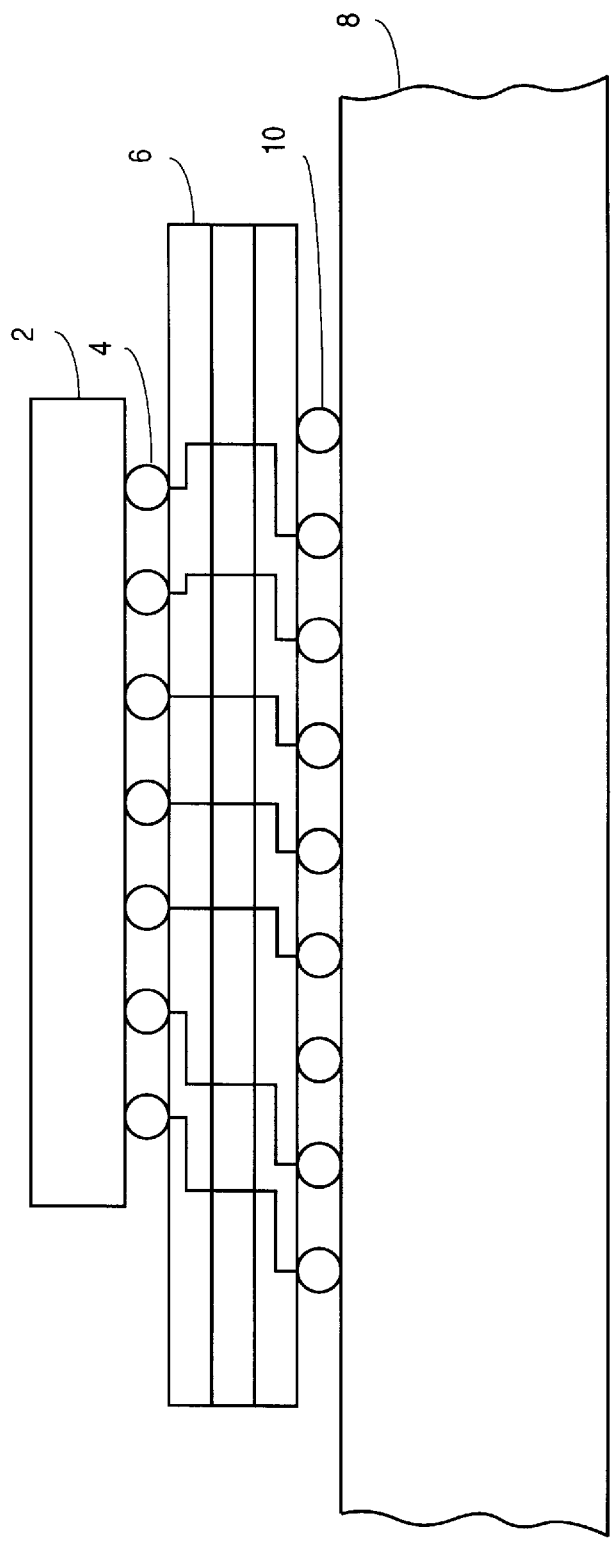
FIG. 1 shows a prior art flip-chip device coupled to a substrate.
Figure 2:
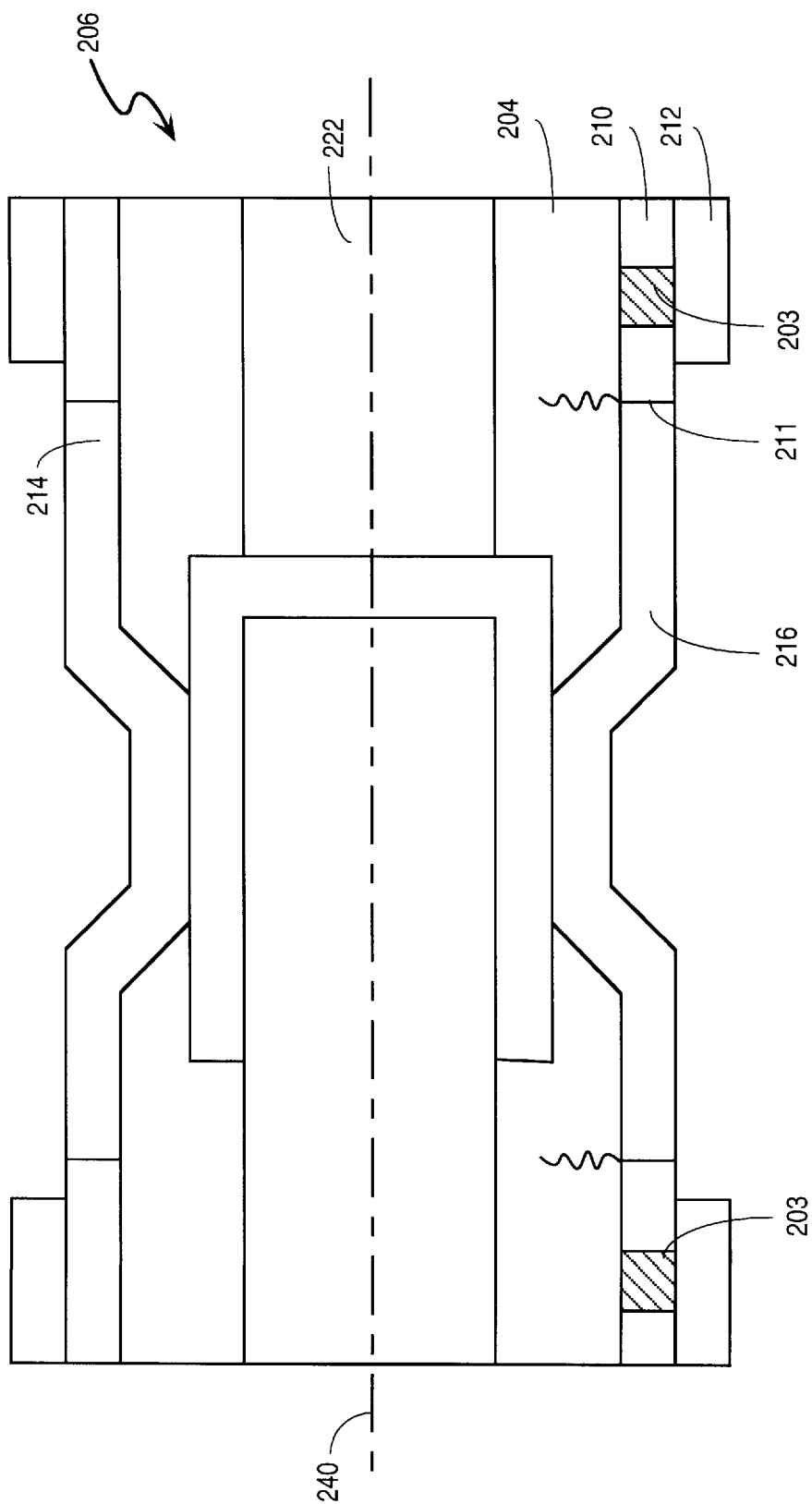
FIG. 2 shows a cross-sectional view of a prior art substrate.
Figure 3:
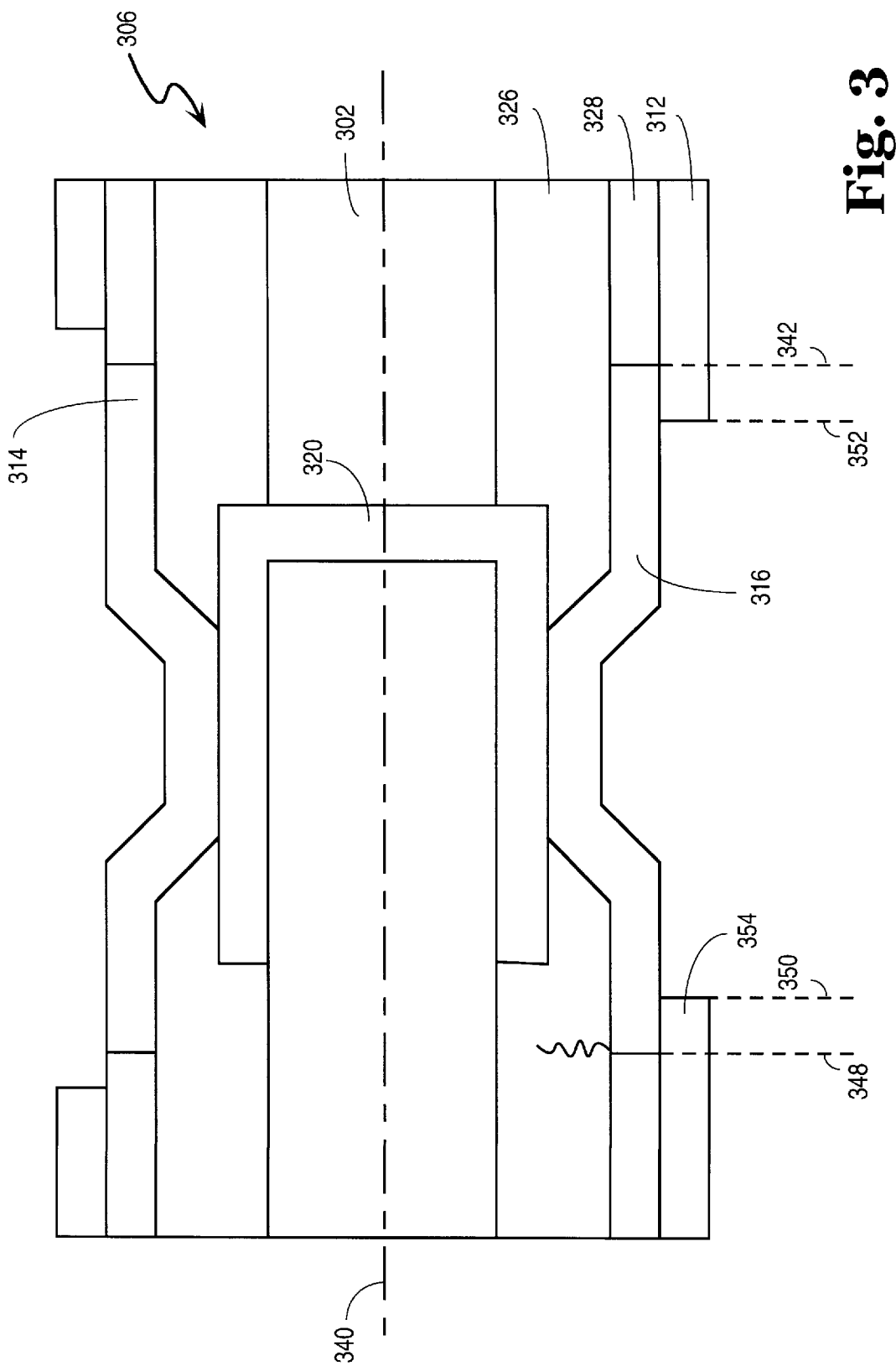
FIG. 3 illustrates a cross-sectional view of a substrate according to the present invention.

FIG. 3 illustrates a cross-sectional view of a substrate according to the present invention. Substrate 306 is typically used in an integrated circuit for interconnecting a chip, typically mounted at the upper part of the substrate (relative to the orientation of the figure) via upper electrode pads 314 (flip chip joint pads) located on an upper surface of substrate 300. A build up layer trace of electrode pad 314 has a minimum thickness of approximately 15 microns and a width of approximately 40 microns. Generally, the pattern of electrode pads 314 corresponds to a pattern of flip chip joint pads, on the flip chip. The flip chip joint pads are each provided with a solder bump for electrically connecting the flip chip to the substrate via the upper electrode pads 314.

Since the structure shown in FIG. 3 is symmetrical about axis 340, the following description focuses on the lower part of the substrate 300, being understood that this description also covers the upper part of the substrate. At the bottom part (relative to the orientation of the substrate in FIG. 3), the substrate 306 can be connected to a printed circuit board (not shown) via the lower electrode land grid array (LGA) pads 316 (hereinafter "lower electrode pads"). The lower electrode pads 316 are configured to conform to a predetermined pattern of pads of the printed circuit board. The circuit board can be electrically connected to the lower electrode pads 316 of the substrate 306 by way of solder bumps placed between the lower electrode pads 316 and the pads of the printed circuit board (not shown).

The substrate 306 includes a core substrate 302 which is made of epoxy combined with a glass termination material. The material of which the core substrate is made is substantially similar to printed circuit board material. The core 302 has a thickness in the range of 0.6–0.8 mm. The core substrate 302 includes a plurality of plated traces of which only trace 320 is shown in the figure. Trace 320 provides electrical interconnection between the upper electrode pad 314 and the lower electrode pad 316 of the substrate 306. One way to form trace 320 is making a hole (not shown) through core 302 and then plating the side walls of the hole with trace 320, although other techniques may be used. The trace 320 has a thickness of approximately 25 microns and a pattern width of approximately 100 microns.

Substrate 306 further includes insulating layer 326, made of a dielectric material that is deposited upon the core 302 using well-known techniques. A permanent mask 328 is then provided by depositing a layer of dielectric material upon insulating layer 326 and etching this layer according to a predetermined pattern that defines the positions of lower electrode pads 316. The width of the layer of dielectric material is approximately 20 microns. The dielectric material forming mask 328 may be an organic material such as epoxy. A first aperture 317, defined by dotted demarcation lines 348 and 342, is formed by the etching process. The first aperture, typically, has a circular form, although other forms that properly accomodate a solder bump can be used.

Lower electrode pads 316 are formed by plating an area, defined by lines 348 and 342, of insulating layer 326. Pads 316 are typically circular and have a land diameter of approximately 0.6 mm. Lower electrode pads 316 have a side surface (not shown) which engages (contacts) the inner side surface of the permanent mask 328 at an interface defined by demarcation lines 342 and 348. Lower electrode pad 316, which is typically made of copper, has a coefficient of thermal expansion (CTE) that is significantly different than the CTE of the second permanent mask 328. Consequently, in the absence of the present invention, if substrate 306 is subjected to thermal fluctuations, the stress concentration formed at the interface between lower electrode pad 316 and permanent mask 328 causes cracks into the permanent mask 328 and insulating layer 326. Cracks may also occur due to a difference in CTE between other adjacent structures of substrate 306.

To overcome this deficiency, the substrate according to the present invention has a second dielectric layer 312 overlaying both a bottom surface of mask 328 and a bottom surface of electrode pool 316. The second dielectric layer is formed by depositing a dielectric material (organic material, for example) onto a bottom surface (not shown) of mask 328 and a bottom surface (not shown) of lower electrode pad 316. The width of the second layer of dielectric material is approximately 25 microns. The deposition of the dielectric material is performed using one of the well-known techniques for such deposition. Dielectric layer 312 is then etched to obtain a second aperture defined by demarcation lines 350 and 352. The second aperture may have a circular form, but the present invention is not limited in this respect. The remaining portions of the second dielectric layer 312 cover both the bottom surface of the mask and a first portion 354 of lower electrode pads 316 thereby. The first portion of the bottom surface of the lower electrode pad 316 is shown between the dotted lines 350 and 348 and dotted lines 352 and 342. This first portion of the bottom surface of the lower electrode pad 316 is adjacent to the interface, defined by lines 342 and 358, between the lower electrode pad 316 and the permanent mask 328.

Second dielectric layer 312 has a CTE that closely matches the CTE of the first dielectric layer 328. Layer 312, disposed as shown in FIG. 3, and having a CTE that closely matches the CTE of the first dielectric layer 328, helps reduce mechanical and electrical stresses associated with the difference in the CTE at the interface between the lower electrode pad 316 and second permanent mask 328.

The second aperture exposes a second portion, that is defined by lines 350 and 352, of the bottom surface of the lower electrode pad 316. The second portion is a portion of the lower electrode pad 316 where a solder bump may be soldered thereto. In this way, the second dielectric layer 312 also acts as a solder resist for the lower electrode pad 316 for demarcating the boundaries of a solder bump soldered or to be soldered to lower electrode pad 316. Moreover, layer 312 protects the permanent mask 328 and the lower electrode 316 against mechanical stress.

Figure 4A:
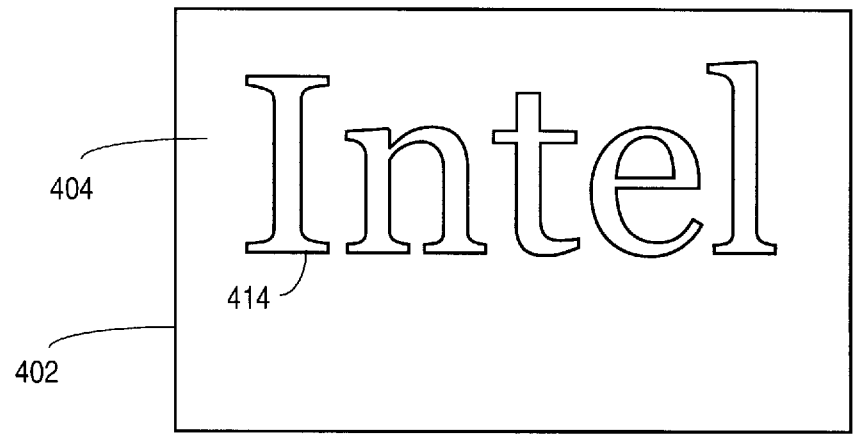
FIG. 4a illustrates a top view of a substrate with a trace logo.

FIG. 4a illustrates a substrate 402 implementing the present invention. A top view of a substrate 402 is shown with top surface 404 having formed thereon a copper trace logo 414 reading "Intel". The trace logo may be formed by depositing a copper layer onto top surface 404 and subsequently etching the copper layer to form a design or a character. A trace code can be equally formed upon the substrate using the same process. The copper trace code includes a numbering scheme and a package ID code, made of copper, formed onto substrate 402. Since the CTE of copper is different from the CTE of the dielectric material forming top surface 404, cracks may occur in substrate 402 if the substrate is subjected to temperature fluctuations, in the absence of the present invention described in more detail in FIG. 4b.

Figure 4B:
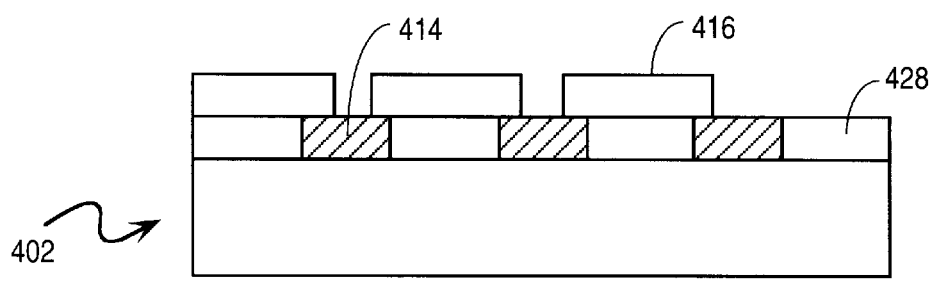
FIG. 4b illustrates a cross-sectional view of a substrate with a trace logo, according to the present invention.

FIG. 4b illustrates a cross-sectional view of substrate 402 according to the present invention. Substrate 402 includes copper traces 414 and mask 428 made of a dielectric material such as epoxy. Several portions 416 of dielectric material are formed upon the mask and upon a portion of traces 414. The portions 416 have a CTE closely matching the coefficient of thermal expansion of layers 428. Portions 416 confer substrate 402, with the trace code 414, the same advantages that were highlighted in the discussion presented in connection with FIG. 3. Accordingly, the present invention may reduce the occurrence of cracks at the interface between dielectric layer 428 and copper traces 414.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A substrate comprising:
   a first dielectric layer having a bottom surface and a side surface defining a first aperture, said first dielectric layer having a first coefficient of thermal expansion (CTE);
   a conductive pad having a bottom surface, and a side surface, said side surface engaging said side surface of said first dielectric layer;
   a second dielectric layer having a second coefficient of thermal expansion closely matching said first coefficient of thermal expansion, said second dielectric layer being formed upon said bottom surface of said first dielectric layer and upon a first portion of said bottom surface of said conductive pad, said first portion being adjacent to the side surface of said conductive pad.

2. The substrate of claim 1 wherein said second dielectric layer has a second aperture therethrough.

3. The substrate of claim 2 wherein said second aperture exposes a second portion of said bottom surface of said conductive pad.

4. The substrate of claim 1 wherein said conductive pad has a top surface.

5. The substrate of claim 4 further including a conductive trace electrically coupled to said top surface of the conductive pad.

6. The substrate of claim 5 further including a third dielectric layer formed upon said top surface of said second dielectric layer and upon a portion of said top surface, of said conductive pad.

7. The substrate of claim 1 wherein said first dielectric layer is a permanent mask.

8. The substrate of claim 7 wherein said first dielectric layer is made of organic material.

9. The substrate of claim 1 wherein said second dielectric layer is a solder resist.

10. The substrate of claim 9 wherein said second dielectric layer is made of an organic material.

11. A substrate comprising:
    a first dielectric layer having a bottom surface and a side surface defining a first aperture, said first dielectric layer having a first coefficient of thermal expansion (CTE);
    a trace character having a bottom surface and a side surface, said side surface engaging said side surface of said first dielectric layer; and
    a second dielectric layer having a second coefficient of thermal expansion closely matching said first coefficient of thermal expansion, said second dielectric layer being formed upon said bottom surface of said first dielectric layer and upon a first portion of said bottom surface of said trace character, said first portion being adjacent to the side surface of said trace character.

12. The substrate of claim 11 wherein said second dielectric layer has a second aperture therethrough.

13. The substrate of claim 12 wherein said second aperture exposes a second portion of said bottom surface of said trace character.

14. A substrate comprising:
    a first dielectric layer having a bottom surface and a side surface defining a first aperture, said first dielectric layer having a first coefficient of thermal expansion (CTE);
    a conductive pad having a bottom surface, and a side surface, said side surface engaging said side surface of said first dielectric layer, said conductive pad positioned within said aperture;
    a second dielectric layer having a second coefficient of thermal expansion closely matching said first coefficient of thermal expansion, said second dielectric layer being formed upon said bottom surface of said first dielectric layer and upon a first portion of said bottom surface of said conductive pad, said first portion being adjacent to the side surface of said conductive pad.

15. The substrate of claim 14 wherein said second dielectric layer has a second aperture therethrough.

16. The substrate of claim 15 wherein said second aperture exposes a second portion of said bottom surface of said conductive pad.

17. The substrate of claim 14 wherein said conductive pad has a top surface.

18. The substrate of claim 17 further including a conductive trace electrically coupled to said top surface of the conductive pad.

19. The substrate of claim 18 further including a third dielectric layer formed upon said top surface of said second dielectric layer and upon a portion of said top surface, of said conductive pad.

20. The substrate of claim 14 wherein said first dielectric layer is a permanent mask.

21. The substrate of claim 20 wherein said first dielectric layer is made of organic material.

22. The substrate of claim 14 wherein said second dielectric layer is a solder resist.

23. The substrate of claim 22 wherein said second dielectric layer is made of an organic material.

24. A substrate comprising:
    a first dielectric layer having a bottom surface and a side surface defining a first aperture, said first dielectric layer having a first coefficient of thermal expansion (CTE);

a trace character having a bottom surface and a side surface, said side surface engaging said side surface of said first dielectric layer, said trace character positioned within said aperture; and a second dielectric layer having a second coefficient of thermal expansion closely matching said first coefficient of thermal expansion, said second dielectric layer being formed upon said bottom surface of said first dielectric layer and upon a first portion of said bottom surface of said trace character, said first portion being adjacent to the side surface of said trace character.

25. The substrate of claim 24 wherein said second dielectric layer has a second aperture therethrough.

26. The substrate of claim 25 wherein said second aperture exposes a second portion of said bottom surface of said trace character.

\* \* \* \* \*

UNITED STATES PATENT AND TRADEMARK OFFICE
CERTIFICATE OF CORRECTION

PATENT NO. : 5,811,883
DATED : September 22, 1998
INVENTOR(S) : Ichikawa et al.

It is certified that error appears in the above-identified patent and that said Letters Patent is hereby corrected as shown below:

Title page,
Item [75], delete "Seiichiroh" and insert -- Seiichiro --.

Column 3,
Line 46, delete "glass" and insert -- grass --.

Signed and Sealed this

Twenty-ninth Day of July, 2003

JAMES E. ROGAN
*Director of the United States Patent and Trademark Office*